United States Patent [19]

Blanchard et al.

[11] Patent Number: 4,742,027

[45] Date of Patent: May 3, 1988

[54] METHOD OF FABRICATING A CHARGE COUPLED DEVICE

[75] Inventors: Pierre Blanchard, Verrieres-Le-Buisson; Pierrick Descure, Biviers; Jacques Chautemps, St. Egreve, all of France

[73] Assignee: Thomson-CSF, Paris, France

[21] Appl. No.: 15,292

[22] Filed: Feb. 17, 1987

Related U.S. Application Data

[62] Division of Ser. No. 531,440, Sep. 12, 1983, Pat. No. 4,695,860.

[30] Foreign Application Priority Data

Sep. 21, 1982 [FR] France ................... 82 15905

[51] Int. Cl.[4] ......................................... H01L 21/425
[52] U.S. Cl. .......................................... 437/2; 357/24; 437/50; 437/53
[58] Field of Search .................. 357/24, 23.5; 29/571, 29/576 B, 578, 580, 591; 437/2, 50, 53

[56] References Cited

U.S. PATENT DOCUMENTS

| | | |
|---|---|---|
| 4,077,112 | 3/1978 | Theunissen et al. ................ 29/580 |
| 4,080,719 | 5/1978 | Wilting ................................... 29/591 |
| 4,099,317 | 7/1978 | Su ........................................... 29/578 |
| 4,201,798 | 5/1980 | Lindmayer ............................ 357/30 |
| 4,215,357 | 7/1980 | Kohyama et al. ................... 357/24 |
| 4,290,187 | 9/1981 | Stein ................................... 29/576 B |
| 4,319,261 | 3/1982 | Kub ...................................... 357/24 |
| 4,332,078 | 6/1982 | Peek et al. ........................... 29/571 |
| 4,347,656 | 9/1982 | Smith et al. .......................... 29/591 |
| 4,397,077 | 8/1983 | Derbenwick et al. ............... 29/591 |
| 4,400,866 | 8/1983 | Yeh et al. ............................. 29/591 |
| 4,451,841 | 5/1984 | Hori ................................... 357/23.6 |

FOREIGN PATENT DOCUMENTS

| | | |
|---|---|---|
| 0003213 | 11/1978 | European Pat. Off. . |
| 0028022 | 10/1980 | European Pat. Off. . |
| 2009506 | 6/1979 | United Kingdom . |

*Primary Examiner*—George T. Ozaki
*Attorney, Agent, or Firm*—Roland Plottel

[57] ABSTRACT

A gate structure for integrated circuits and more especially for photosensitive charge-transfer devices comprises elements of the gate-insulator-semiconductor type. The gate structure is constituted by a thin film-layer of transparent or semi-transparent conductive material covered with a layer of compatible insulating material having a refractive index higher than 1.5.

11 Claims, 2 Drawing Sheets

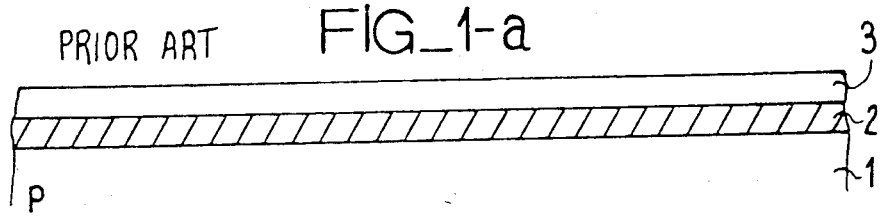
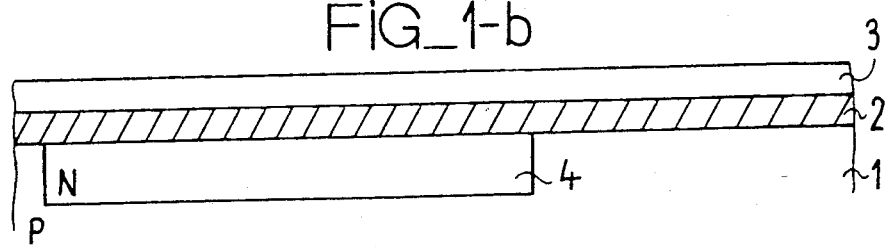
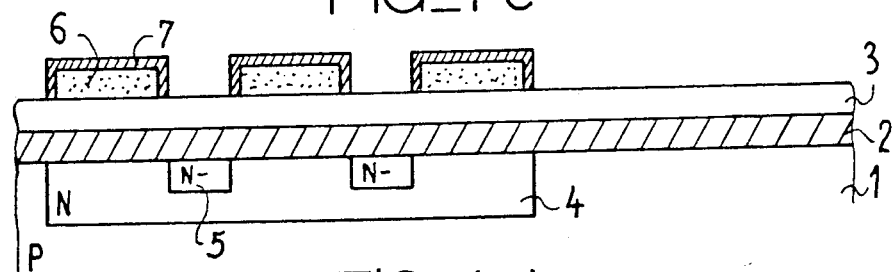
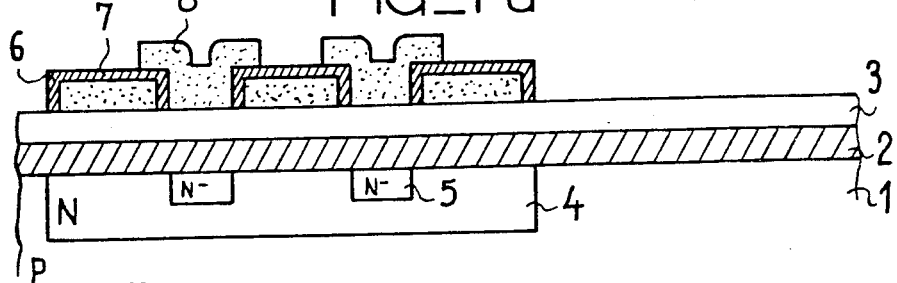
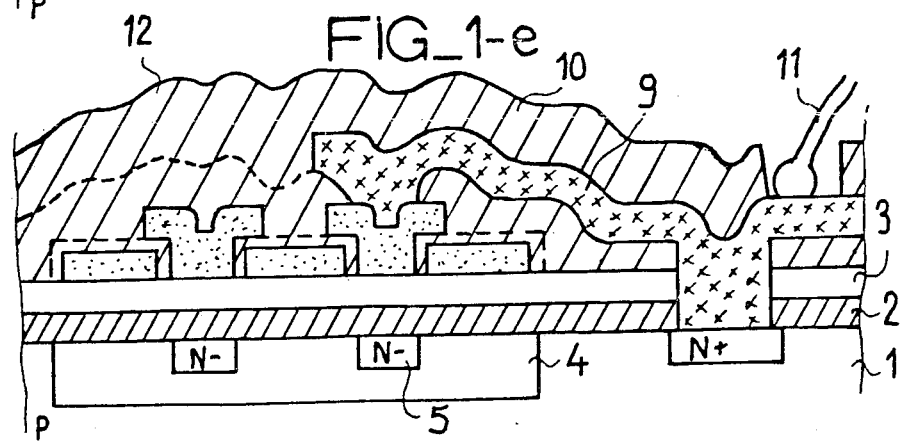

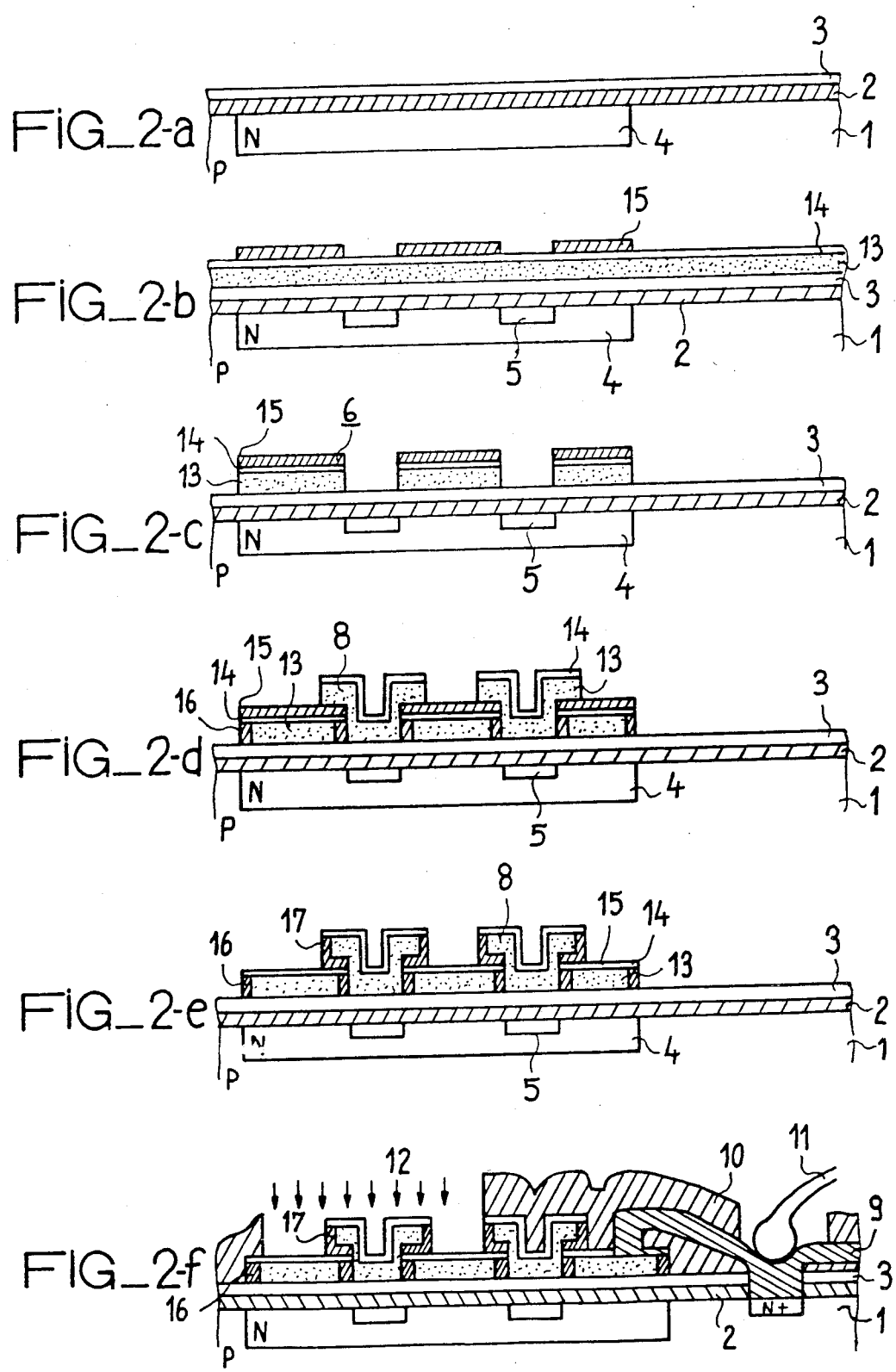

METHOD OF FABRICATING A CHARGE COUPLED DEVICE

RELATED APPLICATIONS

This application is a division of application Ser. No. 531,440 filed Sept. 12, 1983, now U.S. Pat. No. 4,695,860.

BACKGROUND OF THE INVENTION

1. Field of the Invention

This invention relates to a novel gate structure for an integrated circuit comprising elements of the gate-insulator-semiconductor types and also relate to a method of fabrication of an integrated circuit which makes use of said structure.

2. Description of the Prior Art

Known circuits which employ elements of the type just mentioned include in particular the charge-transfer devices as well as circuits using elements of the MOS type (metal-oxide-semiconductor elements). Circuits in this class are now well-known to those versed in the art and are described in particular in the book by C. H. Sequin and M. F. Tompsett entitled "Charge Transfer Devices" or in the article by J. L. Bergen and al. Which was published in the March 1980 edition of "Revue Technique THOMSON-CSF" under the heading "Les dispositifs a transfert de charge". In the circuits mentioned in the foregoing, the gates are made of conductive material which can be either a metal such as aluminum or a metalloid such as strongly doped polycrystalline silicon. However, the techniques of fabrication of integrated circuits comprising elements of the gate-insulator-semiconductor type in which the gate is formed in particular by a layer of polycrystalline silicon do not permit the fabrication of a gate of small thickness.

This problem is particularly objectionable in the case of photosensitive semiconductor devices in which the photosensitive elements or photodetectors are of the gate-insulator-semiconductor type such as, in particular, the charge-transfer devices in which light radiation is directed to charge-transfer registers, and the photosensitive devices of the type designated as CID (Charge Injection Devices) constituted by two MOS capacitors coupled by a gate in which one of the capacitors is subjected to the light radiation to be detected. In fact, in devices of this type, when the front face of the photosensitive device is illuminated, the photons have to pass through the gate and the insulators of the capacitor which forms the photodetector before arriving in the semiconductor material in order to form electron-hole pairs in this latter. The layers referred-to above must therefore be fabricated from materials which are transparent to the radiations to be integrated. Thus in the case of integrated circuits in which the substrate is of silicon, the gate is usually formed of semi-transparent polycrystalline silicon. As mentioned earlier, however, it is difficult to form a gate of small thickness with a material of this type. This result in high attenuation of the light rays which pass through the gate, particularly in the case of blue wavelengths.

SUMMARY OF THE INVENTION

The object of the present invention is to overcome these drawbacks by providing a novel gate structure having a smaller thickness than gates which are in current use, thus permitting enhanced integration density with all the advantages which can thus be gained.

A further object of the invention is to provide a novel gate structure which forms an adapted insulating layer between the surrounding air and the gate proper.

It is also worthy of note that, by virtue of its small thickness, said novel gate structure has better transparency. Thus it is particularly well-suited to photosensitive semiconductor devices comprising photodetectors of the gate-insulator-semiconductor type.

In consequence, the present invention relates to a method for the preparation of an integrated-circuit gate structure comprising elements of the gate-insulator-semiconductor type, the distinctive feature of which lies in the fact that the gate is constituted by a thin film of transparent or semi-transparent conductive material covered with a layer of compatible insulating material having a refractive index higher than 1.5.

BRIEF DESCRIPTION OF THE DRAWINGS

Other features of the invention will become more apparent upon consideration of the following description and accompanying drawings, wherein:

FIGS. 1a to 1e are sectional views of the principal steps in the fabrication of an integrated circuit comprising a gate structure in accordance with the prior art;

FIGS. 2a to 2f are sectional view of the principal steps in the fabrication of an integrated circuit comprising a gate structure in accordance with the present invention.

DESCRIPTION OF THE PREFERRED EMBODIMENT

The same elements which appear in the different figures are designed by the same references but the dimensions and proportions have not been observed for the sake of enhanced clarity. Furthermore, the integrated circuit shown in the drawings consists of a photosensitive charge-coupled device (CCD) but it will be apparent to those versed in the art that the present invention is also applicable to the fabrication of other integrated circuits comprising elements of the gate-insulator-semiconductor type, whether they are photosensitive or not.

It will be recalled that a charge-transfer device of the charge-coupled type known as a CCD is constituted by several arrays of juxtaposed capacitors of the MIS or metal-insulator-semiconductor type forming storage and transfer capacitors.

In accordance with the method of the prior art which is described by way of explanatory illustration, there is formed on a semiconductor substrate 1 of p-type silicon, for example, a first thin and continuous layer 2 of insulating material such as silicon oxide ($SiO_2$), for example, for use as the gate insulator.

Said silicon oxide layer is covered with a second layer 3 of insulating material which cannot be attacked by the same agents as the layer 2 and can consist, for example of silicon nitride ($Si_3N_4$) if the layer 2 is formed of silicon oxide. Typically, and in order to facilitate transmission of photons to the substrate, the thickness chosen for the layers 2 and 3 should be approximately 800 Å.

The next step consists in forming the insulation areas which separate the different transfer channels of the photosensitive device. To this end, the wafer of FIG. 1a is covered with photosensitive lacquer, the insulating areas are then defined by photoetching and the silicon nitride is etched from said areas. The insulating areas are then removed in different ways, either by making use of the Locos technology which consists in oxide growth from the substrate, or by diffusion of impurities of the same type as those of the substrate with an impurity concentration higher than $10^{19}$ atoms/cm$^3$, or else by deposition of a relatively thick layer of insulating material such as silicon oxide.

Each transfer channel is then defined by photoetching by means of a mask and, in the case of volume transfer, doping with impurities is then carried out in order to form a buried channel 4, shown in FIG. 1b. Volume transfer is performed by implantation of impurities of opposite conductivity type with respect to the substrate, namely n-type impurities having a low concentration.

Once the wafer is in the state shown in FIG. 1b, for example, the initial step consists in forming the first level of electrodes or gates in the case of a chargetransfer device having two levels of electrodes. Deposition of a thick layer of 3000 to 5000 Å of suitably doped polycrystalline silicon is therefore performed over the entire surface of the wafer.

By adopting the usual technique of photoetching, the polycrystalline silicon layer is defined and etched in order to form the first level of electrodes. In many instances, it is necessary to carry out double etching of the polycrystalline silicon layer in order to repair the short-circuits which have taken place during the first etching operation. however, the chief drawback of double etching is that is impairs the insulating layer. Once the first level of electrodes has been formed, doping with impurities can be performed in order to obtain dissymmetry means. These asymmetry means are employed in the case of unilateral transfer and provided by implantation of impurities of the same type as the substrate, said implantation being localized within the gaps formed by the transfer capacitors between adjacent storage capacitors underlying the first level of electrodes. As shown in FIG. 1c, it is possible to form a buried channel 4 comprising assymmetrical means. These asymmetrical means are obtained by a compensating p-type implantation to produce the lightly doped (n-) regions. However, it is also possible to carry out unilateral transfer by means of an oxide overthickness at the time of fabrication of the second level of electrodes.

Thermal oxidation of the first level of polycrystalline silicone is then carried out and there is thus obtained the circuit shown in FIG. 1c which a silicon oxide layer 7 is formed on the first level electrodes 6.

The second level of electrodes is then formed. To this end, a thick layer of suitably doped polycrystalline silicon is deposited and etched, if necessary by using the double-etching technique, so as to define the second layer of electrodes 8 which fill in the gaps between the first level of electrodes as shown in FIG. 1d.

By using the photoetching technique, the formation of p-n diodes by ion implantation is then carried out in the usual manner.

This operation is followed by conventional deposition of a layer of pyrolytic oxide having a thickness within the range of 5000 Å to 1 $\mu$m. The vias for contacts are then opened. An aluminum layer is then deposited and etched in order to establish the interconnections 9. The wafer is then covered with a passivation layer 10 which is etched in order to from vias for the soldered connections 11 to remove the layer from 12 as shown in FIG. 1e.

Consideration being given to an integrated circuit of the same type as the circuit described with reference to FIGS. 1a to 1e, the method of fabrication of the gate structure of the present invention will now be described. The steps to be followed until the implantations of impurities are carried out in the case of the buried channel are similar to both methods. In consequence, they will not be described further and FIG. 2a illustrates a wafer which is similar to that of FIG. 1b.

There is then formed on the wafer of FIG. 2a a first level of electrodes having a structure in accordance with the present invention. To this end, there is deposited a thin film-layer 13 of suitably doped polycrystalline silicon having a thickness of 1000 to 3000 Å which is covered with a film-layer 14 of silicon nitride having a thickness of 800 to 1000 Å. The thickness of the polycrystalline silicon layer has been chosen so as to offer sufficient mechanical strength while having good transparency, in particular at the blue wavelengths. Furthermore, the silicon nitride which has a refractive index of 2 is used together with the polycrystalline silicon in order to produce a good index adaptation. If necessary, there is deposited on the silicon nitride layer a layer of polycrystalline silicon having a thickness of 1000 Å to 1 $\mu$m which is oxidized until it is converted to silicon oxide to form layer 15 of silicon oxide. Alternatively, a layer of silicon oxide can be deposited directly. In both cases, the thickness of said oxide layer can be controlled to provide a desired value. Moreover it is also easy to check the thickness of the oxide layer thus obtained and consequently the capacitance produced between the contiguous electrodes. The next step consists in defining by etching the composite layer, the first level of electrodes 6 by means of the usual techniques. In the case of a single etching operation, the three layers formed of silicon oxide, silicon nitride and polycrystalline silicon are opened by means of a mask and the circuit shown in FIG. 2c is thus directly obtained.

In a typical embodiment, the silicon oxide layer 15 is first defined by a plasma etching with a mixture of NHF$_2$ and C$_5$F$_6$, the silicon nitride layer 14 is defined by plasma etching with a mixture of SF$_6$ and helium, and the polysilicone layer 13 is defined by plasma etching with a mixture of SF$_6$, helium and chlorine. Alternatively, the silicon oxide layer 15 can be defined by wet etching with a first mask to achieve the result shown in FIG. 2b and then a second mask is used to etch the layers with plasma etching as described above to achieve the same end result shown in FIG. 2c, in which the layers 13, 14 and 15 serve as the electrode 6.

Thermal oxidation of the polycrystalline silicon is then performed. Since said polycrystalline silicon is covered with a layer of silicon nitride and silicon oxide, there is simply obtained oxidation of the edges 16 of the polycrystalline silicon layer, as seen in FIG. 2d.

In order to form the second level of electrodes, there is again deposited a thin-film layer of polycrystalline silicon which is covered with a layer of silicon nitride.

The second level of electrodes 8 is defined and etched by attach of the silicon nitride layer and polycrystalline silicon layer as shown in FIG. 2d. The exposed portion of oxide layer 15 which covers the first level of electrodes is then removed since it is no longer useful. This removal can be performed by chemical attach of the silicon oxide layer, thermal oxidation of the wafer is then carried out and the edge portion 17 of the polycrystalline silicon layer of the second-level electrodes 8 is converted to silicon oxide (see FIG 2e). The same operations as those mentioned in the prior art structure are performed on the wafer thus obtained in order to define the contacts, the soldered connections, the photosensitive area, and so on. The wafer shown in FIG. 2f is finally obtained.

The gate structure obtained by means of the method described in the foregoing offers many advantages such as:

the possibility of forming the electrodes with a thin film-layer of suitably doped polycrystalline silicon thus improving the transparency of the electrode, which is particularly advantageous in the case of photosensitive elements of the gate-insulator-semiconductor type in photosensitive charge-transfer devices;

the use of a silicon nitride layer having a refractive index of 2, thus permitting a better index adaptation between the different layers;

the possibility of reducing couplings between electrodes or gates by reduction of stray capacitances, thus producing an increase in operating speed;

the increase in integration density which is made possible by the reduced thicknesses; and the possibility of removing the deposited oxides by chemical attack, for example, prior to formation of the contacts or oxides for passivation of aluminum, in which case the silicon nitride constitutes a barrier layer with a passivation function with respect to the active areas and an index-adaptation function with respect to the sensitive areas.

The present invention has been described with reference to a silicon substrate and to a polycrystalline silicon gate. However, it is apparent to those versed in the art that it would be possible to employ a substrate of another semiconductor such as gallium arsenide and gates of metal oxides such as stannic oxide $SnO_2$.

The present invention is more particularly applicable to photosensitive devices which operate with radiations in the visible region, in the near-infrared region or with X-rays of the order of 10 Å. These rays are strongly absorbed by the insulating layers and the structure of the present invention comprising a $Si_3N_4$ layer of 800 Å instead of a $SiO_2$ layer of 1 μm is therefore particularly favorable.

What is claimed is:

1. A method for preparing a photosensitive charge transfer device comprising
   (a) forming over a silicon substrate which is coated with a gate insulator a first composite layer including in succession a polycrystalline layer contacting the gate insulator and a layer of silicon nitride,
   (b) etching the composite layer for forming a plurality of first level electrodes each including a layer of polycrystalline silicon and an overlying layer of silicon nitride, and each spaced apart from one another for providing an intervening gap between adjacent electrodes,
   (c) oxidizing exposed edge regions of the polycrystalline layer of the first level of electrodes,
   (d) depositing over the first level of electrodes a second composite layer including in succession a layer of polycrystalline silicon and an overlying layer of insulating material,
   (e) etching the second composite layer for forming a plurality of second level electrodes, each overlapping a pair of first level electrodes and filing the intervening gap, and each including a layer of polycrystalline silicon and an overlying insulating layer,
   (f) oxidizing the exposed edge regions of the polycrystalline layer of the second level electrodes, and
   (g) forming a passivating layer over first and second level electrodes which are to be shielded from incident radiation.

2. The method of claim 1 in which the first composite layer also includes a layer of silicon oxide over the layer of silicon nitride.

3. The method of claim 2 in which the layer of silicon oxide of the first composite layer is a layer of polycrystalline silicon which was thermally converted to silicon oxide.

4. The method of claim 3 in which the insulating layer of the second composite layer is of silicon nitride and in the first composite layer the layer of polycrystalline silicon is between 1000–3000 Angstroms thick and the layer of silicon nitride is between 8000–1000 Angstroms thick.

5. The method of claim 1 in which the insulating layer of the second composite layer is of silicon nitride.

6. The method of claim 1 in which in the first composite layer the layer of polycrystalline silicon is between 1000–3000 Angstroms thick and the layer of silicon nitride is between 800–1000 Angstroms thick.

7. A method of fabrication of a photosensitive charge-transfer device comprising photosensitive transfer elements of the gate-insulator-semiconductor type, said photosensitive transfer element gates being positioned on two levels, which comprises the following steps.
   depositing on the top surface of a semiconductor substrate at least a first insulating layer,
   forming insulating areas and carrying-out implantations of impurities in said semiconductor substrate,
   depositing on said first insulating layer, a thin layer of semi-transparent doped polycristalline silicon,
   covering said thin layer with a layer of compatible insulating material having a refractive index higher than 1.5,
   depositing on said layer of compatible insulating material a second insulating layer,
   etching the semi-transparent doped polycrystalline silicon layer, the compatible insulating material layer and the second insulating layer to obtain a first level of gates,
   subjecting the gates to thermal oxidation to convert lateral sides of the gates into silicon oxides to obtain an insulating layer,
   deposing a second thin layer of semi-transparent doped polycrystalline silicon,
   covering said second thin layer with a second layer of compatible insulating material having a refractive index higher than 1.5,
   etching the second semi-transparent doped polycrystalline silicon and the second layer of compatible insulating material to obtain a second level of gates, and
   then removing the second insulating layer covering the first level of gates.

8. A method according to claim 7 further comprising the steps of carrying out a thermal oxidation of the device to convert lateral sides of the polycrystalline silicon layer of the second level of gates into silicon oxide.

9. A method according claim 7, wherein the second insulating layer is constituted by an oxide layer.

10. A method according to claim 7, wherein the second insulating layer is constituted by a polycrystalline silicon layer subjected to thermal oxidation until complete conversion into silicon oxide.

11. A method according to claim 7, wherein the compatible insulating material of the first and second layers is silicon nitride.

* * * * *